US006774728B2

(12) United States Patent
Seetharaman et al.

(10) Patent No.: US 6,774,728 B2
(45) Date of Patent: Aug. 10, 2004

(54) TRANSIMPEDANCE AMPLIFIER

(75) Inventors: Shivakumar Seetharaman, Westlake Village, CA (US); Lawrence Huang, La Mirada, CA (US)

(73) Assignee: Intel Corporation, Santa Clara, CA (US)

(*) Notice: Subject to any disclaimer, the term of this patent is extended or adjusted under 35 U.S.C. 154(b) by 0 days.

(21) Appl. No.: 10/324,999

(22) Filed: Dec. 20, 2002

(65) Prior Publication Data

US 2004/0119540 A1 Jun. 24, 2004

(51) Int. Cl.$^7$ .................................................. H03F 3/08
(52) U.S. Cl. .................................. 330/308; 250/214 A
(58) Field of Search ............... 330/308, 85; 250/214 A, 250/214 AG

(56) References Cited

U.S. PATENT DOCUMENTS

| | | | |
|---|---|---|---|
| 4,218,613 A | | 8/1980 | Bletz |
| 4,902,282 A | | 2/1990 | Bellotti et al. |
| 5,430,766 A | | 7/1995 | Ota et al. |
| 5,805,558 A | * | 9/1998 | Kimura ..................... 369/116 |
| 5,892,609 A | * | 4/1999 | Saruwatari ................. 398/202 |
| 6,342,694 B1 | * | 1/2002 | Satoh ...................... 250/214 A |
| 6,552,605 B1 | | 4/2003 | Yoon |
| 6,593,810 B2 | * | 7/2003 | Yoon ............................. 330/69 |
| 2003/0219260 A1 | | 11/2003 | Chiou et al. |

FOREIGN PATENT DOCUMENTS

JP         11-145913         5/1999

OTHER PUBLICATIONS

U.S. patent application Ser. No. 10/324,983, Seetharaman et al., Filed Dec. 20, 2002.
U.S. patent application Ser. No. 10/325,026, Seetharaman et al., Filed Dec. 20, 2002.
U.S. patent application Ser. No. 10/325,048, Seetharaman et al., Filed Dec. 20, 2002.
MacLeod, "On the Bandwidth of Carrier–Type Amplifiers", IEEE Transactions on Circuit Theory, vol. ct–17, No. 3, Aug. 1970 (pp. 367–371).
IEEE Std. 802.3ac—2002, clauses 46, 47 and 51–53.

* cited by examiner

Primary Examiner—Henry Choe
(74) Attorney, Agent, or Firm—Paul G. Nagy

(57) ABSTRACT

Disclosed is a transimpedance amplifier comprising a multi-stage amplifier, a DC current detection circuit to detect a DC current component of an input signal and a DC current removal circuit to substantially remove the DC current component of the input signal.

12 Claims, 5 Drawing Sheets

TRANSIMPEDANCE AMPLIFIER

The subject matter disclosed herein relates to U.S. patent application Ser. No. 10/074,099, filed on Oct. 11, 2001, issued as U.S. Pat. No. 6,552,605, U.S. patent application Ser. No. 10/074,397, filed Feb. 11, 2002, issued as U.S. Pat. No. 6,593,810, and U.S. patent application Ser. Nos. 10/325, 026 and 10/325,048, filed on Dec. 20, 2002, and U.S. patent application Ser. No. 10/324,983, filed on Aug. 9, 2002.

BACKGROUND

1. Field

The subject matter disclosed herein relates to data communication systems. In particular, embodiments disclosed herein relate to processing data received from an optical transmission medium.

2. Information

Optical communication networks have been implemented to enable increased data rates in links providing point to point communication. For example, optical communication links are typically implemented in Synchronous Optical Network/Synchronous Digital Hierarchy (SONET/SDH) and 10 Gigabit Ethernet systems. At a receiving end of such an optical communication link, a photodiode may generate a current in response an optical signal received from an optical transmission medium (e.g., fiber optical cabling). A transimpedance amplifier (TIA) typically converts the current generated by the photodiode into a voltage signal that is then processed. For example, the voltage signal may be processed by clock and data recovery circuitry to recover data transmitted in the optical signal.

BRIEF DESCRIPTION OF THE FIGURES

Non-limiting and non-exhaustive embodiments of the present invention will be described with reference to the following figures, wherein like reference numerals refer to like parts throughout the various figures unless otherwise specified.

DETAILED DESCRIPTION

Figure 1:
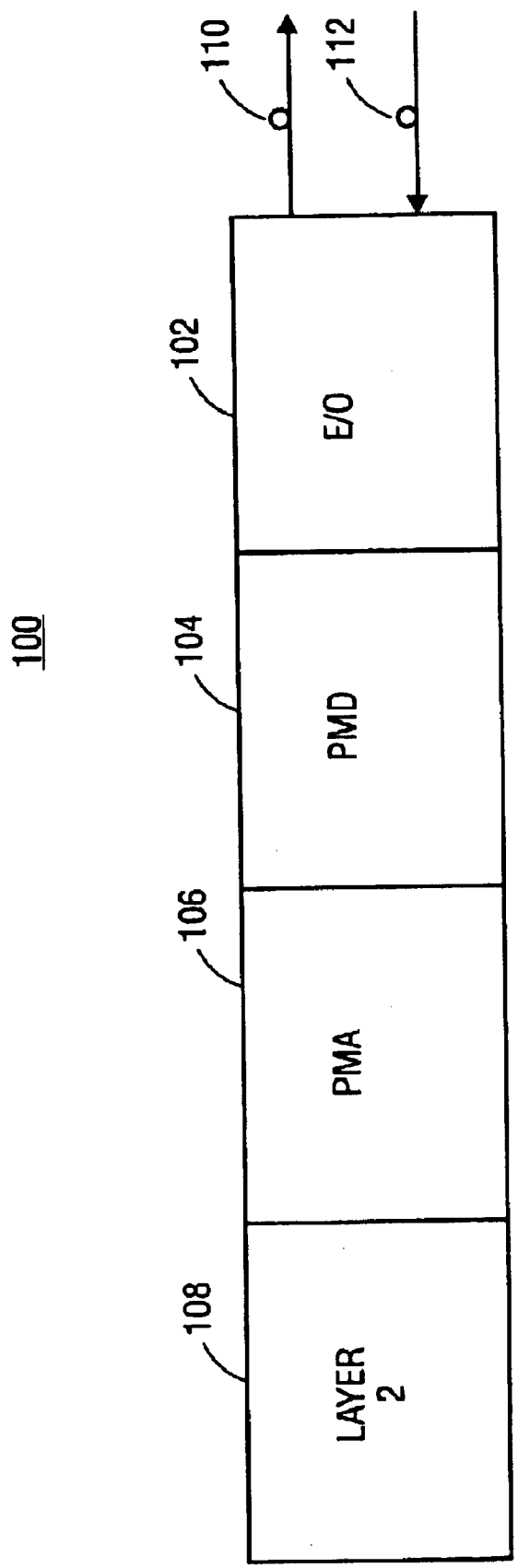
FIG. 1 shows a schematic diagram of a system to transmit data in and receive data from an optical transmission medium according to an embodiment of the present invention.

Reference throughout this specification to one embodiment or an embodiment means that a particular feature, structure, or characteristic described in connection with the embodiment is included in at least one embodiment of the present invention. Thus, the appearances of the phrase in one embodiment or an embodiment in various places throughout this specification are not necessarily all referring to the same embodiment. Furthermore, the particular features, structures, or characteristics may be combined in one or more embodiments.

A photodiode as referred to herein relates to a device that provides an output current in response to light energy collected on a surface. For example, a photodiode may provide an output voltage or an output current in response to charge collected at a photodiode gate. However, this is merely an example of a photodiode and embodiments of the present invention are not limited in this respect.

A transimpedance amplifier (TIA) as referred to herein relates to a device to convert an input current to an output voltage. For example, a TIA may convert an input current received from a photodiode to an output voltage that is substantially proportional to a magnitude of the input current. However, this is merely an example of a TIA and embodiments of the present invention are not limited in these respects.

A single-ended terminal as referred to herein relates to an electrical terminal to transmit or receive a single-ended signal. For example, single-ended terminal may receive a signal as an input signal. However, this is merely an example of a single-ended terminal and embodiments of the present invention are not limited in this respect.

Differential terminals as referred to herein relates to a pair of terminal that may receive or transmit a differential signal. For example, differential terminals signal may express a signal as a voltage difference between the terminals. However, this is merely an example of differential terminals and embodiments of the present invention are not limited in this respect.

DC current as referred to herein relates to a current component in an electrical signal that is substantially constant over a time period. For example, the current in a signal may comprise a DC current component combined with or added to an AC current component that fluctuates over a time period. However, this is merely an example of a DC current and embodiments of the present invention are not limited in these respects.

DC current detection circuit as referred to herein relates to a circuit that is capable of detecting a DC current component in a signal. For example, a DC current detection circuit may generate a signal that is representative of a magnitude of a DC current component in a signal. However, this is merely an example of a DC current detection circuit and embodiments of the present invention are not limited in this respect.

DC current removal circuit as referred to herein relates to a circuit to substantially remove a DC current component from a signal. For example, a DC current removal circuit may substantially remove a DC current component from a signal having a DC current and AC current component, resulting in an isolated AC current component. However, this is merely an example of a DC current removal circuit and embodiments of the present invention are not limited in this respect.

Briefly, an embodiment of the present invention relates to a TIA comprising a single ended input terminal to receive an input signal from a photodiode and a DC current detection circuit to detect a DC current component in the input signal. A DC current removal circuit may be coupled to the single ended input terminal to substantially remove the DC current component. However, this is merely an example embodiment and other embodiments of the present invention are not limited in these respects.

FIG. 1 shows a schematic diagram of a system to transmit in and receive data from an optical transmission medium according to an embodiment of the present invention. An optical transceiver 102 may transmit or receive optical signals 110 or 112 in an optical transmission medium such as fiber optic cabling. The optical transceiver 102 may modulate the transmitted signal 110 or demodulate the received signal 112 according to any optical data transmission format such as, for example, wave division multiplexing wavelength division multiplexing (WDM) or multi-amplitude signaling (MAS). For example, a transmitter portion (not shown) of the optical transceiver 102 may employ WDM for transmitting multiple lanes of data in the optical transmission medium.

A physical medium dependent (PMD) section 104 may provide circuitry, such as a TIA (not shown) and/or limiting amplifier (LIA) (not shown), to receive and condition an electrical signal from the optical transceiver 102 in response to the received optical signal 112. The PMD section 104 may also provide to a laser device (not shown) in the optical transceiver 102 power from a laser driver circuit (not shown) for transmitting an optical signal. A physical medium attachment (PMA) section 106 may include clock and data recovery circuitry (not shown) and de-multiplexing circuitry (not shown) to recover data from a conditioned signal received from the PMD section 104. The PMA section 106 may also comprise multiplexing circuitry (not shown) for transmitting data to the PMD section 104 in data lanes, and a serializer/deserializer (Serdes) for serializing a parallel data signal from a layer 2 section 108 and providing a parallel data signal to the layer 2 section 108 based upon a serial data signal provided by the clock and data recovery circuitry.

According to an embodiment, the layer 2 section 108 may comprise a media access control (MAC) device coupled to the PMA section 106 at a media independent interface (MII) as defined IEEE Std.802.3ae-2002, clause 46. In other embodiments, the layer 2 section 108 may comprise forward error correction logic and a framer to transmit and receive data according to a version of the Synchronous Optical Network/Synchronous Digital Hierarchy (SONET/SDH) standard published by the International Telecommunications Union (ITU). However, these are merely examples of layer 2 devices that may provide a parallel data signal for transmission on an optical transmission medium, and embodiments of the present invention are not limited in these respects.

The layer 2 section 108 may also be coupled to any of several input/output (I/O) systems (not shown) for communication with other devices on a processing platform. Such an I/O system may include, for example, a multiplexed data bus coupled to a processing system or a multi-port switch fabric. The layer 2 section 108 may also be coupled to a multi-port switch fabric through a packet classification device. However, these are merely examples of an I/O system which may be coupled to a layer 2 device and embodiments of the present invention are not limited in these respects.

The layer 2 device 108 may also be coupled to the PMA section 106 by a backplane interface (not shown) over a printed circuit board. Such a backplane interface may comprise devices providing a 10 Gigabit Ethernet Attachment Unit Interface (XAUI) as provided in IEEE Std. 802.3ae-2002, clause 47. In other embodiments, such a backplane interface may comprise any one of several versions of the System Packet Interface (SPI) as defined by the Optical Internetworking Forum (OIF). However, these are merely examples of a backplane interface to couple a layer 2 device to a PMA section and embodiments of the present invention are not limited in these respects.

Figure 2:
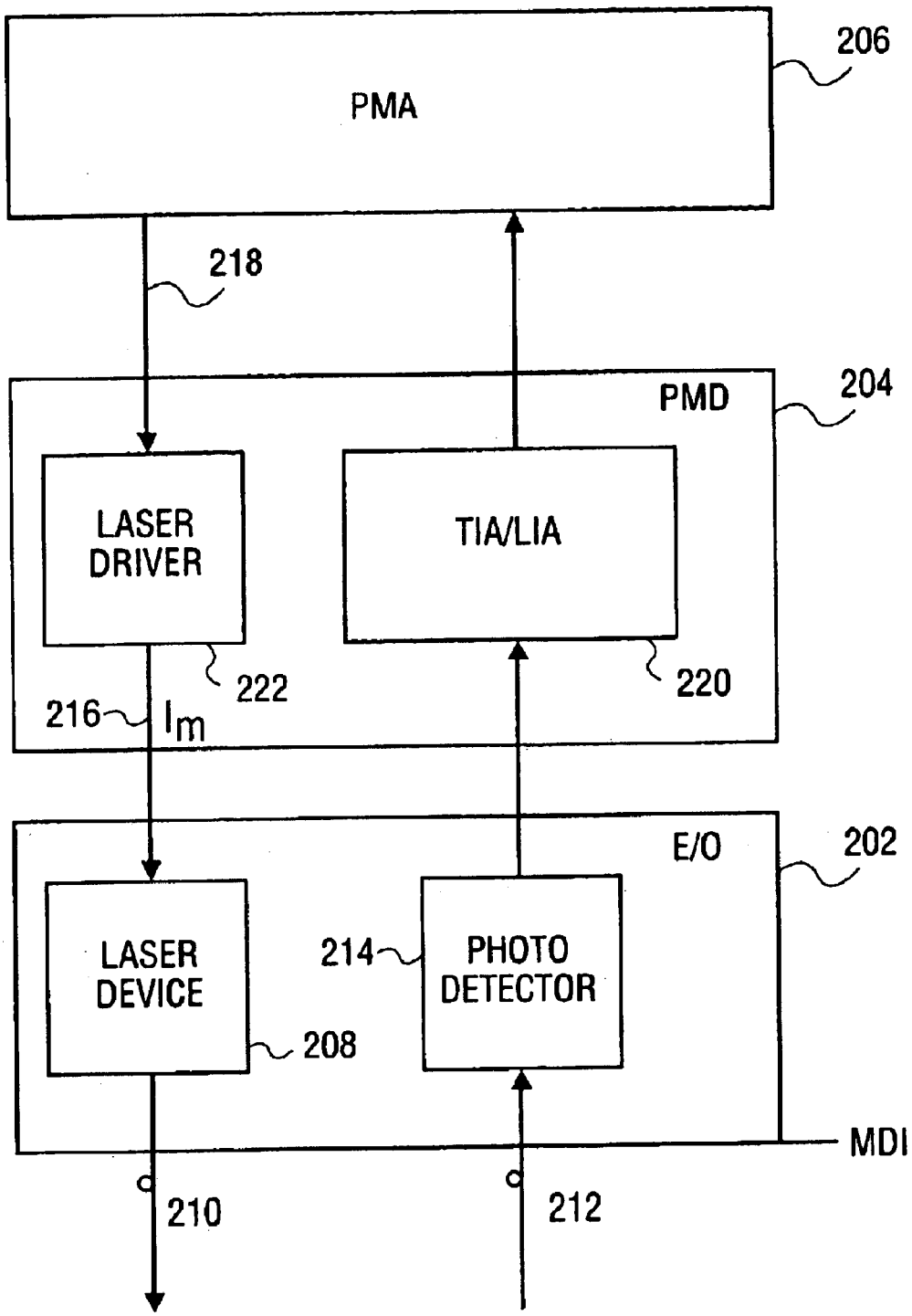
FIG. 2 shows a schematic diagram of physical medium attachment (PMA) and physical medium dependent (PMD) sections of a data transmission system according to an embodiment of the system shown in FIG. 2.

FIG. 2 shows a schematic diagram of a system 200 to transmit data in and receive data from an optical transmission medium according to an embodiment of the system shown in FIG. 2. An optical transceiver 202 comprises a laser device 208 to transmit an optical signal 210 in an optical transmission medium and a photo detector section 214 to receive an optical signal 212 from the optical transmission medium. The photo detector section 214 may comprise one or more photodiodes (not shown) for converting the received optical signal 212 to one or more electrical signals to be provided to a TIA/LIA circuit 220. A laser driver circuit 222 may modulate a modulation current 216 in response to a data signal from a PMA section 206. A laser device 208 may then modulate and power the transmitted optical signal 210 in response to the modulation current 216.

Figure 3:
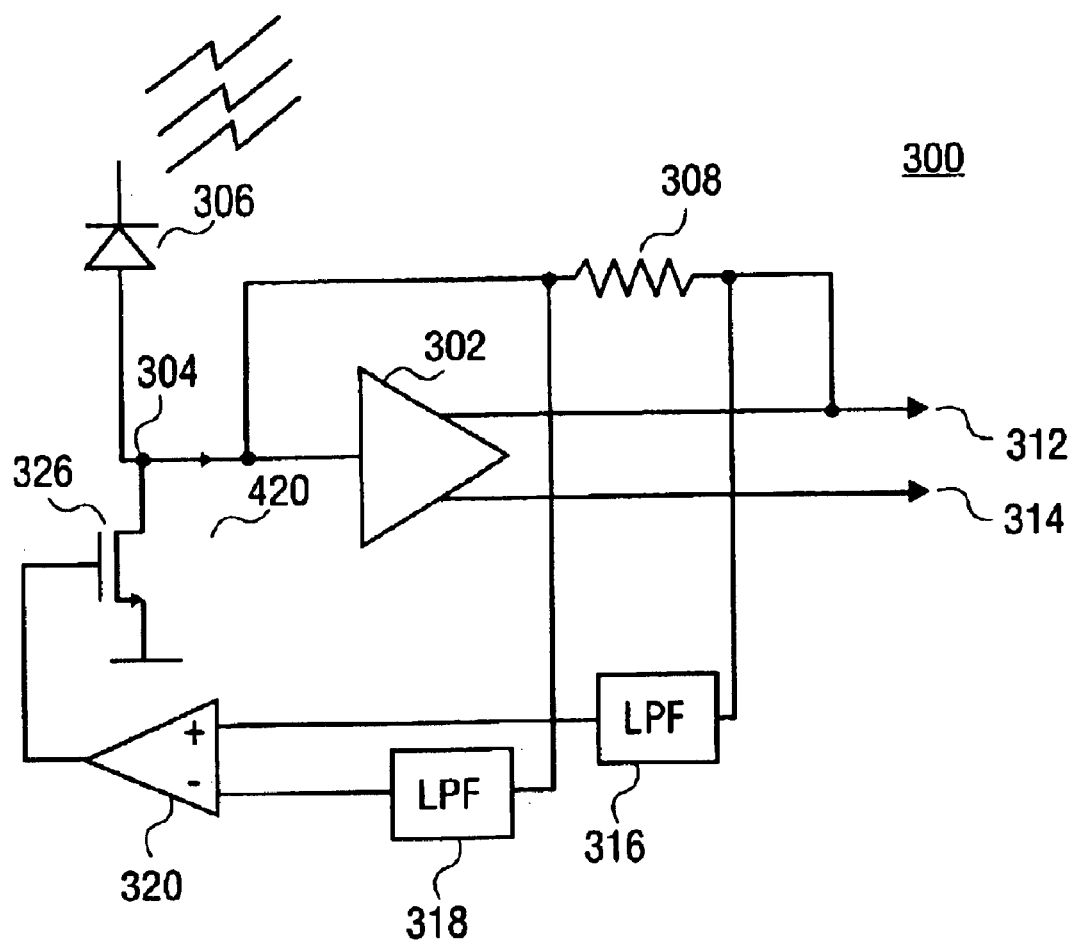
FIG. 3 shows a schematic diagram of a transimpedance amplifier (TIA) according to an embodiment of the PMD section shown in FIG. 2.

FIG. 3 shows a schematic diagram of a TIA 300 according to an embodiment of the PMD section shown in FIG. 2. An amplifier 302 may receive a single-ended input 304 from a photodiode 306 which is responsive to an optical data signal and provides a differential output at output terminals 312 and 314. The TIA 300 may be formed as part of an integrated device (e.g., as part of a single device including the TIA 300 and other portions of the PMD section) in a semiconductor process such as a complementary metal oxide semiconductor (CMOS) manufacturing process. However, this is merely an example of a process that may be used to form a TIA and embodiments of the present invention are not limited in this respect.

Figure 4:
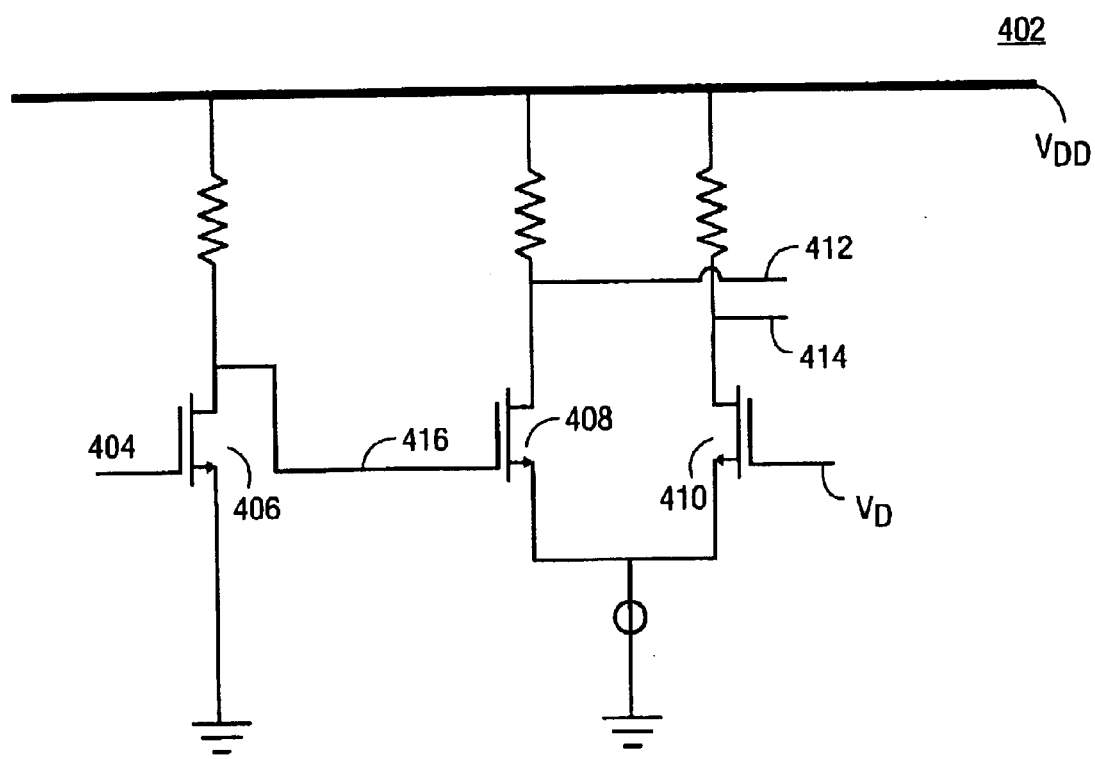
FIG. 4 shows a schematic diagram of a multistage amplifier according to an embodiment of the TIA shown in FIG. 3.

FIG. 4 shows a schematic diagram of an amplifier 402 according to an embodiment of the amplifier 302 shown in FIG. 3. A first amplification stage comprises a transistor 406. A gate of the transistor 406 may receive a single ended input signal on a single-ended input terminal 404 from the photodiode 306. In response to the input signal, a second amplification stage comprising a differential amplifier formed by transistors 408 and 410 may provide an output voltage on differential output terminals 412 and 414. However, this is merely an example of a multi-stage amplifier that may be implemented in a TIA and embodiments of the present invention are not limited in this respect.

According to an embodiment, the output terminal 312 provides feedback signal to the single-ended signal 304 through a resistor 308. An input voltage $V_{in}$ at the single-ended input 304 may be substantially proportional to an output voltage $V_{out}$ at an output terminal 312. A voltage across the resistor 308 may be substantially proportional to the magnitude of the current provided at the single-ended input 304. As such, the voltage across the resistor 308 may have a DC current component and an AC current component that are substantially proportional to the magnitudes of respective DC and AC current components of the input signal received at the single ended input 304. Voltages at the terminals of the resistor 308 are provided to low pass filters (LPFs) 316 and 318 to substantially remove the AC component of the voltage across the resistor 308. Accordingly, the voltage between the outputs of the LPFs 316 and 318 may be substantially proportional to the DC component in the voltage across the resistor 308.

Figure 5:
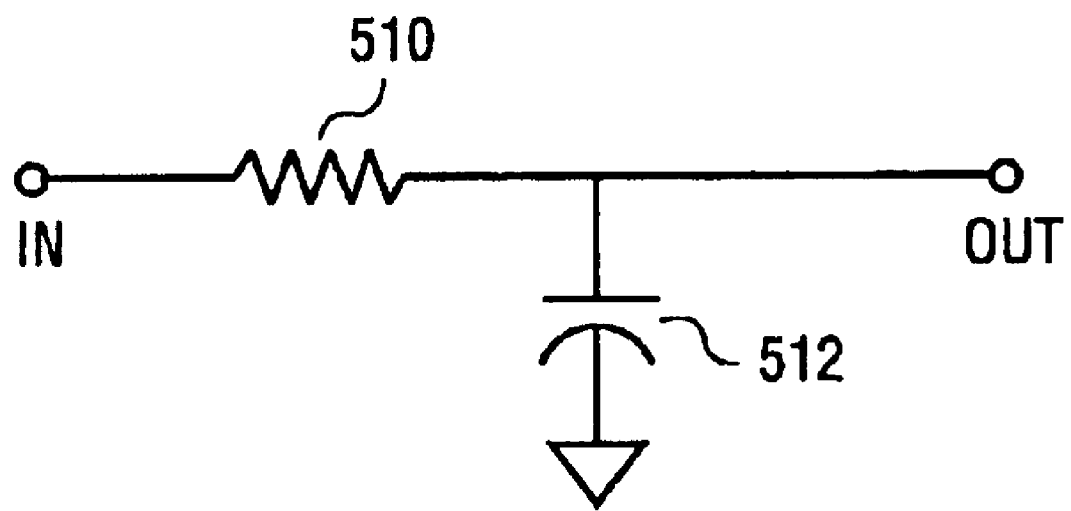
FIG. 5 shows a schematic diagram of a low pass filter according to an embodiment of the TIA shown in FIG. 3.

According to an embodiment, the LPFs 316 and 318 may be any LPF formed using a resistor 510 and capacitor 512 as shown in FIG. 5. However, this is merely an example of how a LPF may be formed in a circuit and embodiments of the present invention are not limited in these respects.

The outputs of the LPFs 316 and 318 may each be provided to a corresponding input terminal of an operational amplifier 320. The operational amplifier 320 may then provide a voltage to a gate of a transistor 326 that is substantially proportional to the voltage difference between the outputs of the LPFs 316 and 318. The transistor 326 may then offset all or a portion of a current at the single-ended input 304 that is substantially proportional to the DC component in the voltage across the resistor 308. Using techniques known to those of ordinary skill in the art of analog circuit design, the resistance of resistor 308, gain of operational amplifier 320 and size of transistor 326 may be selected such that current removed from the single-ended input 304 by the transistor 326 removes substantially all or a portion of the DC component of current at the single-ended input 304.

By removing substantially all or a portion of the DC current component at the single-ended input 304, downstream processing may more accurately recover data received from the photodiode 306. For example, removing substantially all or a portion of the DC current component may better align an amplitude of an eye pattern signal to be processed by clock and data recovery circuitry in a PMA section, resulting in a reduced bit error rate.

While there has been illustrated and described what are presently considered to be example embodiments of the present invention, it will be understood by those skilled in the art that various other modifications may be made, and equivalents may be substituted, without departing from the true scope of the invention. Additionally, many modifications may be made to adapt a particular situation to the teachings of the present invention without departing from the central inventive concept described herein. Therefore, it is intended that the present invention not be limited to the particular embodiments disclosed, but that the invention include all embodiments falling within the scope of the appended claims.

What is claimed is:

1. A transimpedance amplifier comprising:
   a single ended input terminal to receive an input signal from a photodiode;
   differential output terminals to provide an output signal in response to the input signal:
   a DC current detection circuit to detect a DC current component in the input signal based upon a voltage detected across a resistor coupled between the single ended input terminal and one of the differential output terminals; and
   a DC current removal circuit coupled to the single ended input terminal to substantially remove at least a portion of the DC current component.

2. The transimpedance amplifier of claim 1, wherein the DC current removal circuit comprises a current sink transistor coupled to the single ended input terminal to remove a current in response to the DC voltage detected across the resistor.

3. The transimpedance amplifier of claim 1, wherein the DC current detection circuit further comprises:
   a first low pass filter coupled to a first terminal of the resistor to provide a first filtered voltage; and
   a second low pass filter coupled to a second terminal of the resistor to provide a second filtered voltage.

4. The transimpedance amplifier of claim 3, wherein the DC current removal circuit comprises a current sink transistor coupled to the single ended input terminal to remove a current in response to the first and second filtered voltages.

5. A method comprising:
   receiving an input signal from a photodiode at a single ended input terminal of a transimpedance amplifier;
   detecting a DC current component in the input signal based, at least in part, on a DC voltage detected across a resistor coupled between the single ended output terminal and a differential output terminal; and
   removing at least a portion of the a DC current component from the single ended input terminal.

6. The method of claim 5, wherein removing at least a portion of the a DC current component from the single ended input terminal further comprises applying a voltage to a gate of a current sink transistor coupled to the single ended input terminal in response to the DC voltage detected across the resistor.

7. The method of claim 5, wherein detecting the DC current component in the input signal further comprises:
   low pass filtering a signal from a first terminal of the resistor to provide a first filtered voltage; and
   low pass filtering a signal from a second terminal of the resistor to provide a second filtered voltage.

8. The method of claim 7, wherein removing at least a portion of the a DC current component from the single ended input terminal further comprises applying a voltage to a current sink transistor coupled to the single ended input terminal in response to the first and second filtered voltages.

9. An apparatus comprising:
   means for receiving an input signal from a photodiode at a single ended input terminal of a transimpedance amplifier;
   means for detecting a DC current component in the input signal based, at least in part, on a DC voltage detected across a resistor coupled between the single ended output terminal and a differential output terminal; and
   means for removing at least a portion of the a DC current component from the single ended input terminal.

10. The apparatus of claim 9, wherein the means for removing at least a portion of the a DC current component from the single ended input terminal further comprises means for applying a voltage to a gate of a current sink transistor coupled to the single ended input terminal in response to the DC voltage detected across the resistor.

11. The apparatus of claim 9, wherein the means for detecting the DC current component in the input signal further comprises:
   means for low pass filtering a signal from a first terminal of the resistor to provide a first filtered voltage; and
   means for low pass filtering a signal from a second terminal of the resistor to provide a second filtered voltage.

12. The apparatus of claim 11, wherein the means for removing at least a portion of the a DC current component from the single ended input terminal further comprises means for applying a voltage to a current sink transistor coupled to the single ended input terminal in response to the first and second filtered voltages.

* * * * *

UNITED STATES PATENT AND TRADEMARK OFFICE
CERTIFICATE OF CORRECTION

PATENT NO. : 6,774,728 B2  
DATED : August 10, 2004  
INVENTOR(S) : Seetharaman et al.

It is certified that error appears in the above-identified patent and that said Letters Patent is hereby corrected as shown below:

Column 6,  
Lines 10 and 37, immediately before "DC", delete "a".

Signed and Sealed this

Twenty-fifth Day of January, 2005

JON W. DUDAS  
*Director of the United States Patent and Trademark Office*